(12) United States Patent
Kawaguchi et al.

(10) Patent No.: US 7,697,353 B2
(45) Date of Patent: Apr. 13, 2010

(54) SEMICONDUCTOR DEVICE

(75) Inventors: Kazuaki Kawaguchi, Kawasaki (JP);
Naoaki Kanagawa, Yokohama (JP)

(73) Assignee: Kabuhsiki Kaisha Toshiba, Tokyo (JP)

( * ) Notice: Subject to any disclaimer, the term of this patent is extended or adjusted under 35 U.S.C. 154(b) by 350 days.

(21) Appl. No.: 11/928,970

(22) Filed: Oct. 30, 2007

(65) Prior Publication Data
US 2008/0101130 A1 May 1, 2008

(30) Foreign Application Priority Data
Oct. 30, 2006 (JP) ............................ 2006-293504

(51) Int. Cl.
G11C 7/00 (2006.01)
G11C 5/06 (2006.01)
G11C 7/10 (2006.01)

(52) U.S. Cl. ............... 365/189.18; 365/63; 365/189.02; 365/189.03; 365/189.05; 365/189.08

(58) Field of Classification Search ................... 365/63, 365/189.02, 189.03, 189.17, 189.18, 189.05
See application file for complete search history.

(56) References Cited

U.S. PATENT DOCUMENTS 6,061,266 A * 5/2000 Tan ............................ 365/145
6,333,894 B1 12/2001 Nakayama et al.
7,035,153 B2 4/2006 Hayashi et al.
7,307,912 B1 * 12/2007 Vernenker et al. ...... 365/230.05
2005/0185493 A1 8/2005 Fujioka et al.
2008/0225622 A1 * 9/2008 Hidaka ................... 365/230.03

FOREIGN PATENT DOCUMENTS

JP 3222545 8/2001

* cited by examiner

Primary Examiner—Ly D Pham
(74) Attorney, Agent, or Firm—Oblon, Spivak, McClelland, Maier & Neustadt, L.L.P.

(57) ABSTRACT

A semiconductor device includes plural memory cell blocks, each having a memory array of plural memory cells. Plural control circuits are provided in correspondence with each of the memory cell blocks, for writing information to the memory cell blocks and for reading information written in the memory cell blocks. Plural input/output terminals are for inputting the information to be written and for outputting the information to be read. Plural multiplexers are provided in correspondence with each of the input/output terminals, for conveying the information to be written from the input/output terminals and for conveying the information to be read to the input/.output terminals. A bidirectional transfer type buffer is connected to each connection line between the control circuits and the multiplexers, for selectively conveying information from the control circuits to each of the multiplexers and for selectively conveying information from the multiplexers to each of the control circuits.

12 Claims, 12 Drawing Sheets

US 7,697,353 B2

SEMICONDUCTOR DEVICE

CROSS-REFERENCE TO RELATED APPLICATIONS

This application is based upon and claims the benefit of priority from the prior Japanese Patent Application No. 2006-293504, filed on Oct. 30, 2006, the entire contents of which are incorporated herein by reference.

BACKGROUND OF THE INVENTION

1. Field of the Invention

The present invention relates to a semiconductor device, and in particular, to the field of data transfer technology in memory.

2. Description of the Related Art

There are increasing demands for a semiconductor memory with improved integration density and speed as well as enhanced capacity. For example, a pseudo static RAM (PSRAM) for use in mobile phones is expected to reach the 256- to 512-Mbit size from the currently used 128-Mbit size. Conventionally, in order to meet the demands for enhanced capacity, improving the integration density enables reduction of memory chip area as well as improved speed in memory chips.

However, as the recent increase in integration density, wiring resistance also increases in chips, which has prohibited improvements in chip speed.

Therefore, Patent Document 1 (Japanese Patent Laid-Open No. 3222545) discloses an invention for improving speed of memory in chips. In the invention disclosed in Patent Document 1, plural memory cell brocks as sub-arrays are formed, and each system between each of the memory cell blocks and I/O terminals is independent from one another. That is, memory cell blocks A and B are formed and input/output terminals A and B are provided corresponding to each memory cell block. One system ranging from memory cell block A to an input/output terminal A, and another system ranging from memory cell block B to an input/output terminal B, are completely independent from each other. Only data input from the input/output terminal A can be written in the memory cell block A for writing data to the memory cell block A, and data can only be output to the input/output terminal A for reading data from the memory cell block A. Similarly, only data input from the input/output terminal B can be written in the memory cell block B for writing data to the memory cell block B, and data can only be output to the input/output terminal B for reading data from the memory cell block B.

As such, in the system of the invention described in Patent Document 1 has a following problem. Specifically, the system may be formed as a multi-chip package of a combination of a controller and memory. In this case, a pad used in memory may be changed depending on the type of controller. However, it is extremely difficult to change the pad being used due to the one-to-one correspondence between each memory cell block and each input/output terminal.

SUMMARY OF THE INVENTION

A semiconductor device in accordance with one aspect of the present invention comprises: two or more memory cell blocks, each of which has a memory cell array of a plurality of memory cells; a plurality of control circuits, which are provided in correspondence with each of the memory cell blocks, for writing information to the memory cell blocks and for reading information written in the memory cell blocks; a plurality of input/output terminals for inputting the information to be written and for outputting the information to be read; a plurality of multiplexers, which are provided in correspondence with each of the input/output terminals, for conveying the information to be written from the input/output terminals and for conveying the information to be read to the input/output terminals; and a bidirectional transfer type buffer, which is connected to each connection line between the control circuits and the multiplexers, for selectively conveying information from the control circuits to each of the multiplexers and for selectively conveying information from the multiplexers to each of the control circuits.

In addition, a semiconductor device in accordance with one aspect of the present invention comprises: two or more memory cell blocks, each of which has a memory cell array of a plurality of memory cells; a plurality of control circuits, which are provided in correspondence with each of the memory cell blocks, for writing information to the memory cell blocks; a plurality of input terminals for inputting the information to be written; a plurality of multiplexers, which are provided in correspondence with each of the input terminals, for conveying the information input from the input terminals; and a bidirectional transfer type buffer, which is connected to each connection line between the control circuit and the multiplexer, for selectively conveying information from the multiplexers to each of the control circuits.

In addition, a semiconductor device in accordance with one aspect of the present invention comprises: two or more memory cell blocks, each of which has a memory cell array of a plurality of memory cells; a plurality of control circuits, which are provided in correspondence with each of the memory cell blocks, for reading information written in the memory cell blocks; a plurality of output terminals for outputting the information to be read; a plurality of multiplexers, which are provided in correspondence with each of the output terminals, for conveying the information to be read to the output terminals; and a bidirectional transfer type buffer, which is connected to each connection line between the control circuits and the multiplexers, for selectively conveying information from the control circuits to each of the multiplexers.

DETAILED DESCRIPTION OF THE EMBODIMENTS

An embodiment of the present invention will now be described below.

First Embodiment

Figure 1:
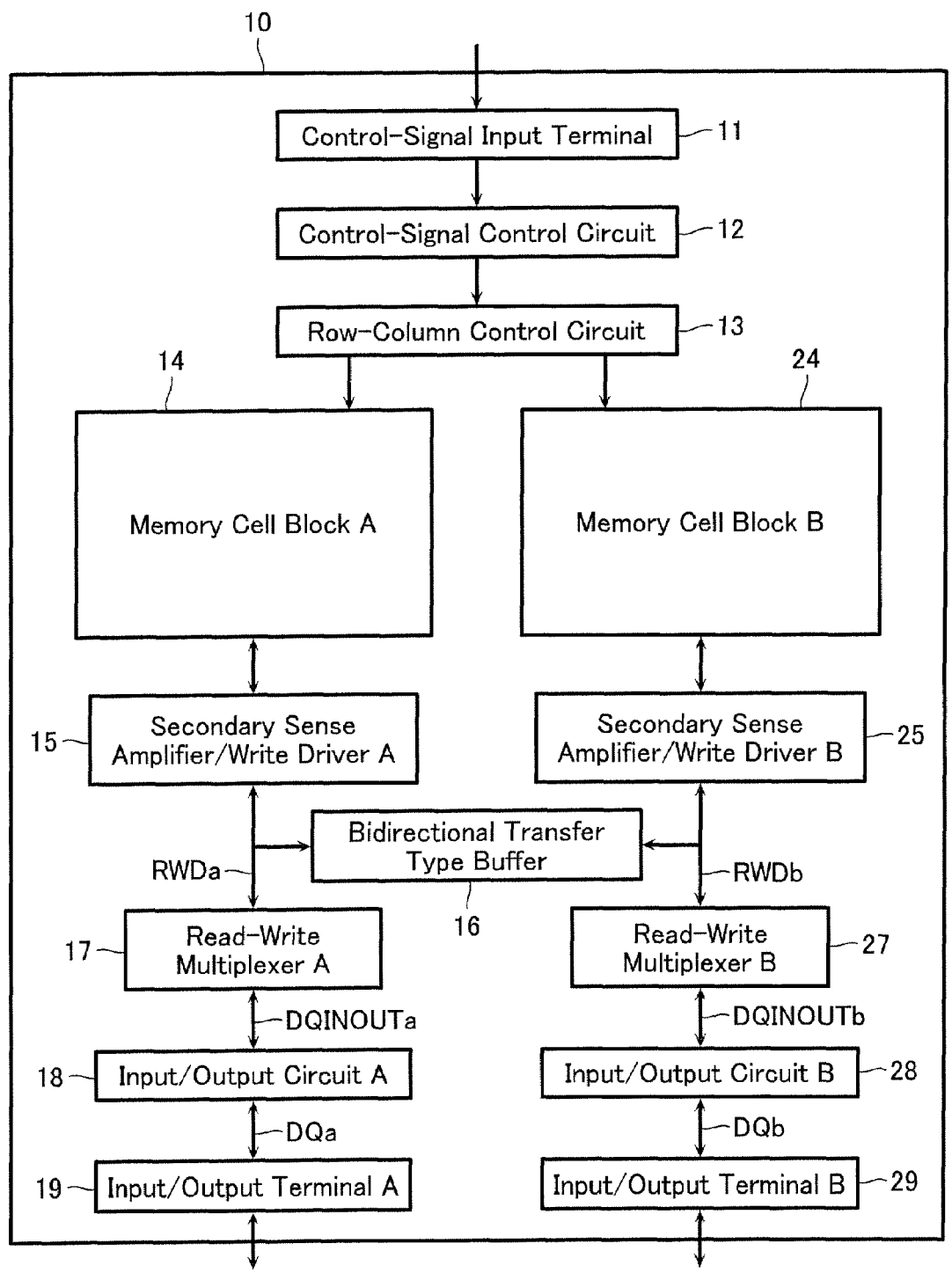
FIG. 1 is a configuration diagram of a semiconductor device in accordance with a first embodiment.

FIG. 1 illustrates a pseudo static RAM (PSRAM) 10 in accordance with this embodiment. The pseudo static RAM (PSRAM) 10 of this embodiment has a control-signal input terminal 11 for inputting control signals from outside, which is conveyed to a control-signal control circuit 12. In the control-signal control circuit 12, a control signal is generated based on the input control signal to control each of memory cell blocks A 14 and B 24 via a row-column control circuit 13.

In addition, input and output of data in the pseudo static RAM (PSRAM) 10 of this embodiment are performed through an input/output terminal A 19 and an input/output terminal B 29. The input/output terminals A 19 and B 29 are connected to their corresponding input/output circuits A 18 and B 28 through a DQa line and a DQb line, respectively, while the input/output circuits A 18 and B 28 are connected to their corresponding read-write multiplexers A 17 and B 27 through a DQINOUTa line and a DQINOUTb line, respectively.

The read-write multiplexers A 17 and B 27 are connected to their corresponding control circuits of this embodiment, i.e., secondary sense amplifiers/write drivers A 15 and B 25 through an RWDa line and an RWDb line, respectively. In addition, a bidirectional transfer type buffer 16 is provided between, and also connected to, the RWDa line (a connection line between the read-write multiplexer A 17 and the secondary sense amplifier/write driver A 15) and the RWDb line (a connection line between the read-write multiplexer B 27 and the secondary sense amplifier/write driver B 25).

Figure 2:
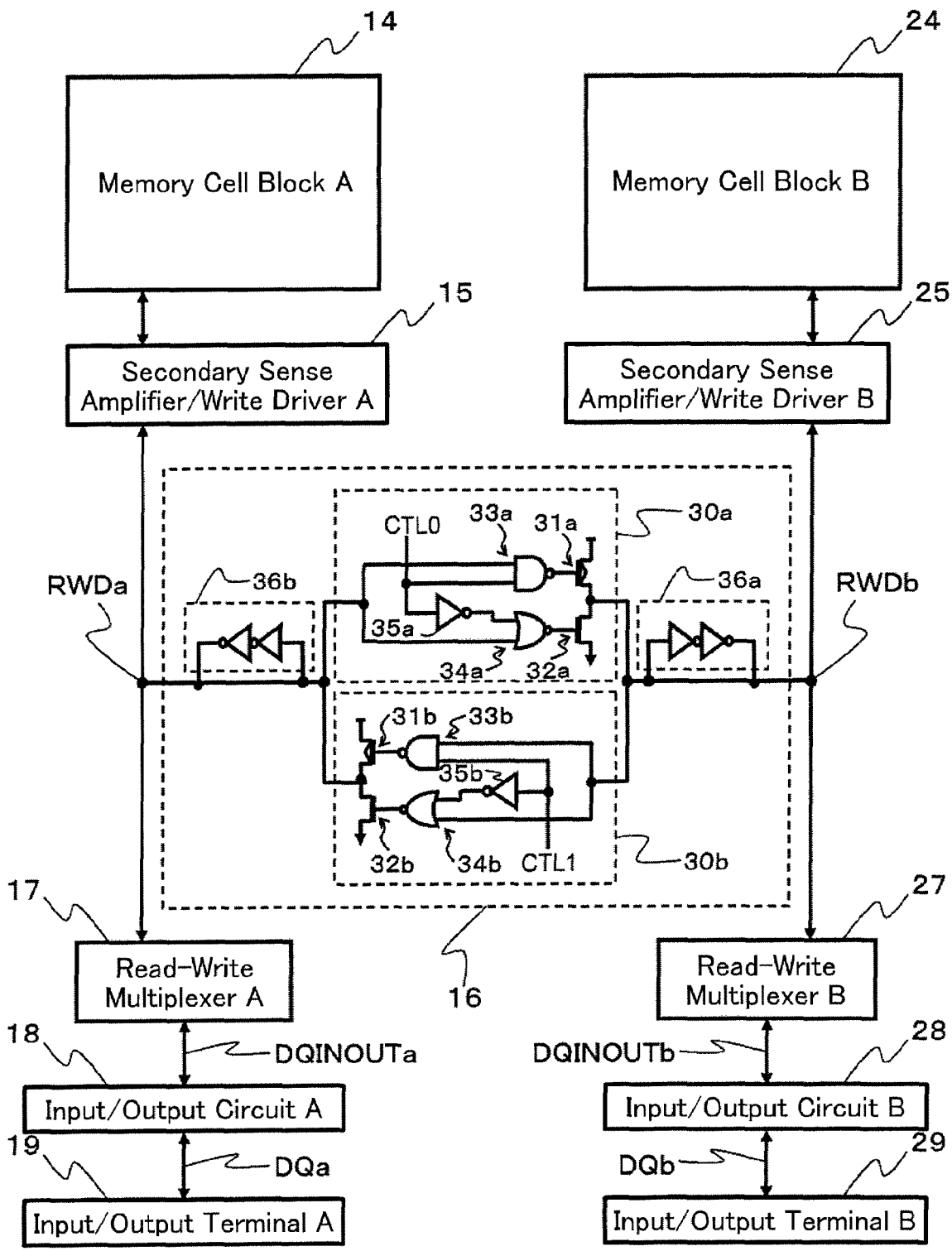
FIG. 2 is a configuration diagram illustrating essential parts of the semiconductor device in accordance with the first embodiment.

Next, the bidirectional transfer type buffer 16 will be described in detail based on FIG. 2. FIG. 2 illustrates a peripheral configuration of the bidirectional transfer type buffer 16 in the pseudo static RAM (PSRAM) 10 illustrated in FIG. 1.

The bidirectional transfer type buffer 16 of this embodiment comprises two transfer circuits 30a and 30b. The transfer circuit 30a has a function of transferring information from the RWDa line to the RWDb line. The transfer circuit 30b has a function of transferring information from the RWDb line to the RWDa line. The output terminal of one of the transfer circuits 30a and 30b is connected to the input terminal of the other of these transfer circuits, and vice versa.

In each transfer circuit 30a and 30b, drains of a p-type transistor 31a and an n-type transistor 32a are connected to each other, and drains of a p-type transistor 31b and an n-type transistor 32b are connected to each other, thereby forming each output terminal of the transfer circuits 30a and 30b, respectively. Each output terminal of NAND circuits 33a and 33b is connected to each gate of the p-type transistors 31a and 31b, respectively. In addition, each output terminal of NOR circuits 34a and 34b is connected to each gate of the n-type transistors 32a and 32b, respectively. One input terminal of each of the NAND circuits 33a and 33b and one input terminal of each of the NOR circuits 34a and 34b are connected to each other, thereby forming each input terminal of the transfer circuits 30a and 30b, respectively. That is, each information from the connection lines RWDa and RWDb is input to the one input terminal of each of the NAND circuits 33a and 33b and the one input terminal of each of the NOR circuits 34a and 34b. In addition, the other input terminal of each of the NAND circuits 33a and 33b and the other input terminal of each of the NOR circuits 34a and 34b via inverters 35a and 35b are connected to each other, and each input terminal is connected to each input terminal for control signals CTL0 and CTL1, respectively. That is, control signals CTL0 and CTL1 are input to the other input terminal of each of the NAND circuits 33a and 33b, while inverted signals of the control signals CTL0 and CTL1 are input to the other input terminal of each of the NOR circuits 34a and 34b.

In addition, the output terminal of the transfer circuit 30a, which is configured by a connection point between the drains of the p-type transistor 31a and the n-type transistor 32a, is connected to the input terminal of the transfer circuit 30b. The input terminal of the transfer circuit 30b is formed by connecting one input terminal of the NAND circuit 33b to one input terminal of the NOR circuit 34b. The input terminal of the transfer circuit 30b is also connected to the connection line RWDb between the secondary sense amplifier/write driver B 25 and the read-write multiplexer B 27. In addition, a data retaining circuit 36a is provided for the connection line RWDb.

On the other hand, the output terminal of the transfer circuit 30b, which is configured by a connection point between the drains of the p-type transistor 31b and the n-type transistor 32b, is connected to the input terminal of the transfer circuit 30a. The input terminal of the transfer circuit 30a is formed by connecting one input terminal of the NAND circuit 33a to one input terminal of the NOR circuit 34a. The input terminal of the transfer circuit 30a is also connected to the connection line RWDa between the secondary sense amplifier/write driver A 15 and the read-write multiplexer A 17. In addition, a data retaining circuit 36b is provided for the connection line RWDa.

Next, a reading method in the pseudo static RAM (PSRAM) 10 of this embodiment will be described.

Figure 3:
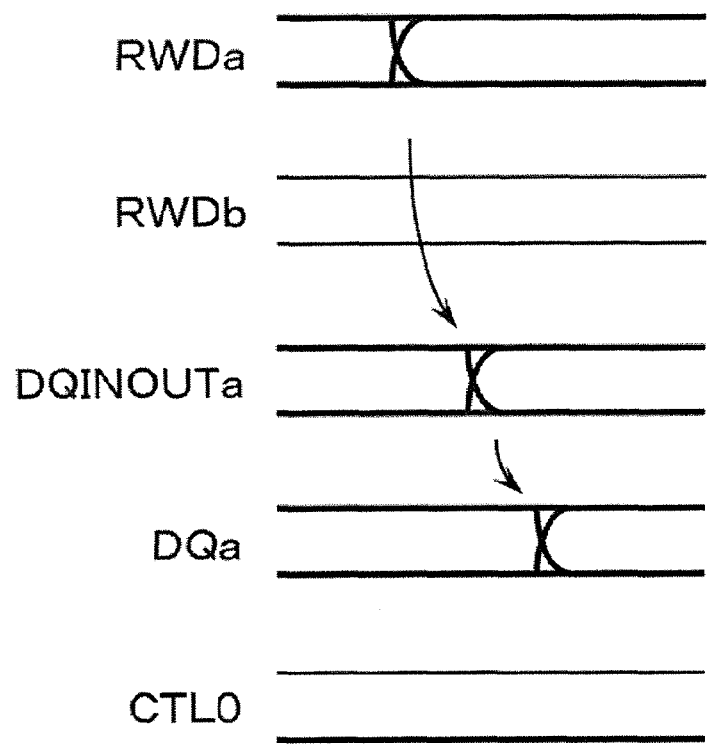
FIG. 3 illustrates a read operation (1) of the semiconductor device in accordance with the first embodiment.

As illustrated in FIG. 3, when information stored in the memory cell block A 14 is read via the input/output terminal A 19, the information does not need to be conveyed via the bidirectional transfer type buffer 16. Thus, the information read from the memory cell block A 14 is conveyed to the secondary sense amplifier/write driver A 15. Thereafter, the bidirectional transfer type buffer 16 would not operate since the CTL0 remains "L" when information is conveyed to the connection line RWDa, to which the secondary sense amplifier/write driver A 15, the read-write multiplexer A 17 and the bidirectional transfer type buffer 16 are connected, and the information in the connection line RWDa is conveyed to the connection line DQINOUTa via the read-write multiplexer A 17. The information is then conveyed to the connection line DQa via the input/output circuit A 18 and output from the input/output terminal A 19. In this case, the information is conveyed directly from the secondary sense amplifier/write driver A 15 to the read-write multiplexer A 17.

Figure 4:
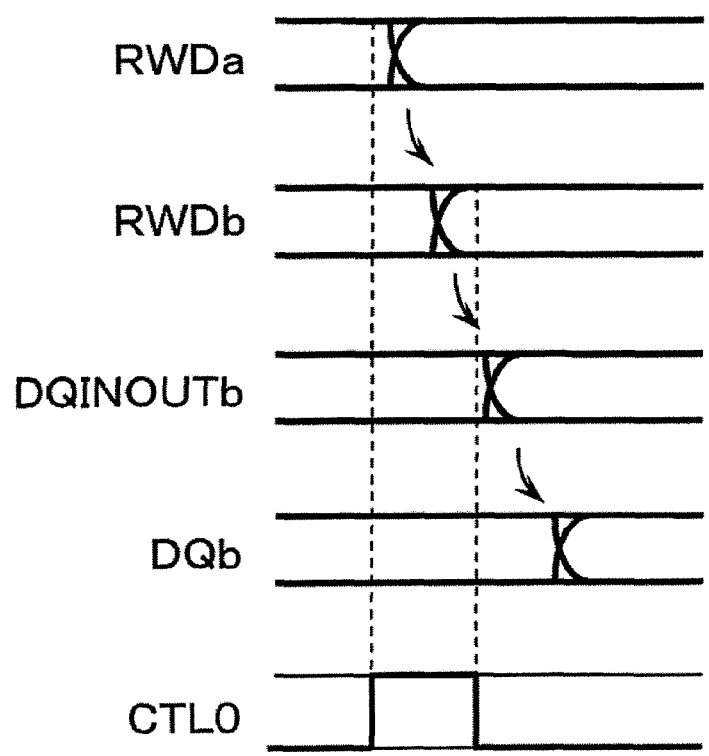
FIG. 4 illustrates a read operation (2) of the semiconductor device in accordance with the first embodiment.

As illustrated in FIG. 4, when information stored in the memory cell block A 14 is read by the input/output terminal B 29, the information needs to be conveyed via the bidirectional transfer type buffer 16. Thus, the information read from the memory cell block A 14 is conveyed to the secondary sense amplifier/write driver A 15. Thereafter, upon the information being conveyed to the connection line RWDa, to which the secondary sense amplifier/write driver A 15, the read-write multiplexer A 17 and the bidirectional transfer type buffer 16 are connected, the CTL0 turns to "H". Accordingly, the information in the connection line RWDa is conveyed to the connection line RWDb via the bidirectional transfer type buffer 16. Then, the information conveyed to the connection line RWDb is further conveyed to the connection line DQINOUTb via the read-write multiplexer B 27 and subsequently to the DQb line via the input/output circuit B 28, after which it is output from the input/output terminal B 29.

Figure 5:
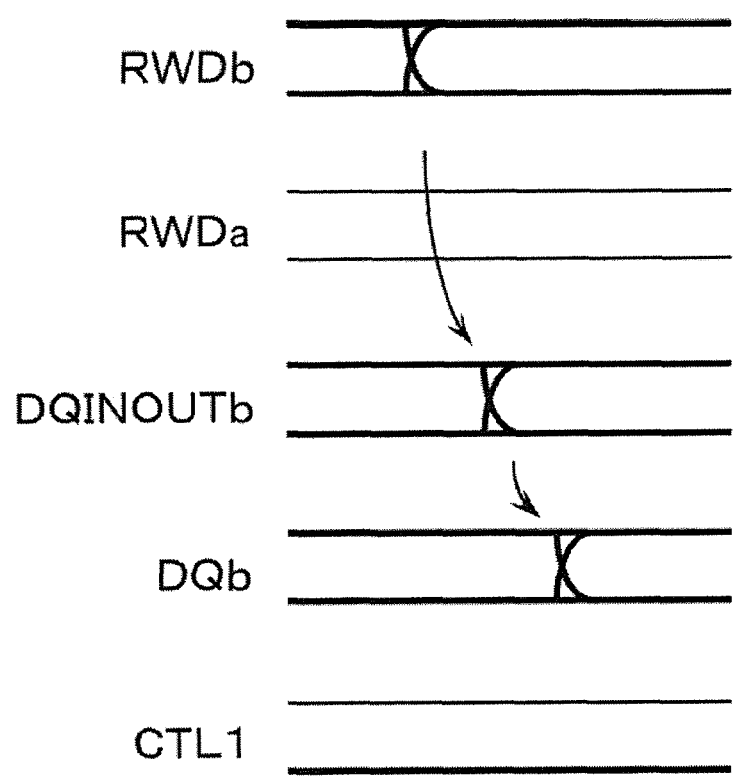
FIG. 5 illustrates a read operation (3) of the semiconductor device in accordance with the first embodiment.

As illustrated in FIG. 5, when information stored in the memory cell block B 24 is read by the input/output terminal B 29, the information does not need to be conveyed via the bidirectional transfer type buffer 16. Thus, the information read from the memory cell block B 24 is conveyed to the secondary sense amplifier/write driver B 25. Thereafter, the bidirectional transfer type buffer 16 would not operate since the CTL1 remains "L" when the information is conveyed to the connection line RWDb, to which the secondary sense amplifier/write driver B 25, the read-write multiplexer B 27 and the bidirectional transfer type buffer 16 are connected, and the information in the connection line RWDb is conveyed to the connection line DQINOUTb via the read-write multiplexer B 27 and subsequently to the connection line DQb via the input/output circuit B 28, after which it is output from the input/output terminal B 29. In this case, the information is conveyed directly from the secondary sense amplifier/write driver B 25 to the read-write multiplexer B 27.

Figure 6:
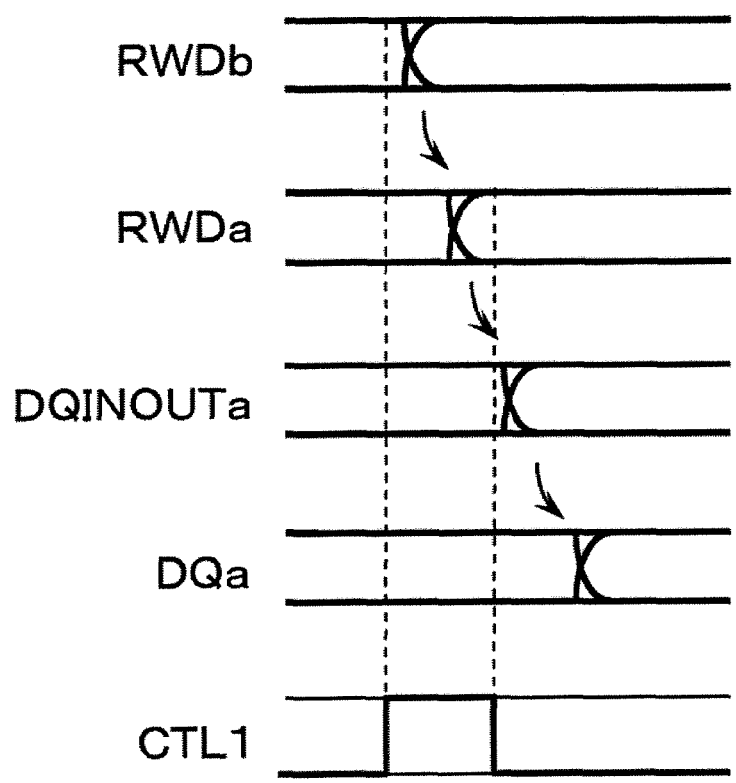
FIG. 6 illustrates a read operation (4) of the semiconductor device in accordance with the first embodiment.

As illustrated in FIG. 6, when information stored in the memory cell block B 24 is read by the input/output terminal A 19, the information needs to be conveyed via the bidirectional transfer type buffer 16. Thus, the information read from the memory cell block B 24 is conveyed to the secondary sense amplifier/write driver B 25. Thereafter, upon the information being conveyed to the connection line RWDb, to which the secondary sense amplifier/write driver B 25, the read-write multiplexer B 27 and the bidirectional transfer type buffer 16 are connected, the CTL1 turns to "H". Accordingly, the information in the connection line RWDb is conveyed to the connection line RWDa via the bidirectional transfer type buffer 16. Then, the information conveyed to the connection line RWDa is further conveyed to the connection line DQINOUTa via the read-write multiplexer A 17 and subsequently to the connection line DQa via the input/output circuit A 18, after which it is output from the input/output terminal A 19.

Next, a writing method in the pseudo static RAM (PSRAM) 10 of this embodiment will be described.

Figure 7:
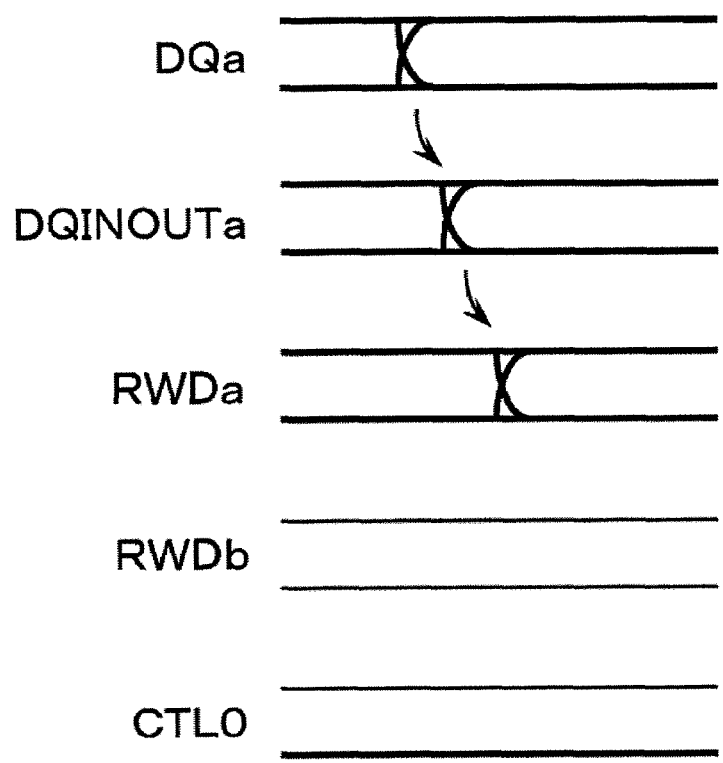
FIG. 7 illustrates a write operation (1) of the semiconductor device in accordance with the first embodiment.

As illustrated in FIG. 7, when the information input from the input/output terminal A 19 is written in the memory cell block A 14, the information does not need to be conveyed via the bidirectional transfer type buffer 16. Thus, the information input from the input/output terminal A 19 is conveyed to the connection line DQa and then to the connection line DQINOUTa via the input/output circuit A 18. The information conveyed to the connection line DQINOUTa is further conveyed via the read-write multiplexer A 17 to the connection line RWDa, to which the read-write multiplexer A 17, the secondary sense amplifier/write driver A 15 and the bidirectional transfer type buffer 16 are connected. At this moment, the bidirectional transfer type buffer 16 would not operate since the CTL0 remains "L", and the input information is conveyed to the secondary sense amplifier/write driver A 15 and then written in a memory cell in a predetermined region of the memory cell block A 14. In this case, the information is conveyed directly from the read-write multiplexer A 17 to the secondary sense amplifier/write driver A 15.

Figure 8:
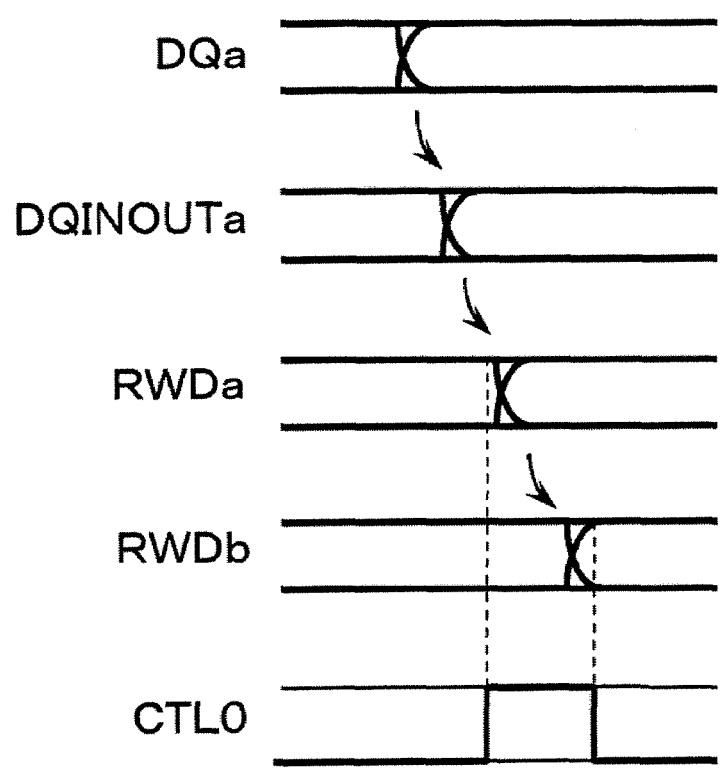
FIG. 8 illustrates a write operation (2) of the semiconductor device in accordance with the first embodiment.

As illustrated in FIG. 8, when the information input from the input/output terminal A 19 is written in the memory cell block B 24, the information needs to be conveyed via the bidirectional transfer type buffer 16. Thus, the information input from the input/output terminal A 19 is conveyed to the connection line DQa and then to the connection line DQINOUTa via the input/output circuit A 18. The information conveyed to the connection line DQINOUTa is further conveyed via the read-write multiplexer A 17 to the connection line RWDa, to which the read-write multiplexer A 17, the secondary sense amplifier/write driver A 15 and the bidirectional transfer type buffer 16 are connected. At this moment, the CTL0 turns to "H" and the information conveyed to the connection line RWDa is further conveyed to the connection line RWDb via the bidirectional transfer type buffer 16. Then, the information conveyed to the connection line RWDb is further conveyed to the secondary sense amplifier/write driver B 25 and written in a memory cell in a predetermined region of the memory cell block B 24.

Figure 9:
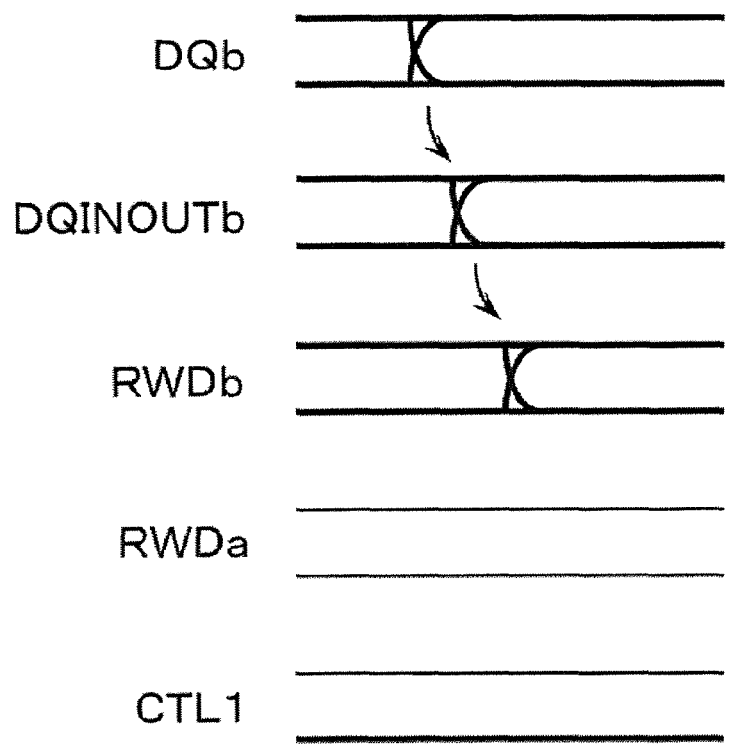
FIG. 9 illustrates a write operation (3) of the semiconductor device in accordance with the first embodiment.

As illustrated in FIG. 9, when the information input from the input/output terminal B 29 is written in the memory cell block B 24, the information does not need to be conveyed via the bidirectional transfer type buffer 16. Thus, the information input from the input/output terminal B 29 is conveyed to the connection line DQb and then to the connection line DQINOUTb via the input/output circuit B 28. The information conveyed to the connection line DQINOUTb is further conveyed via the read-write multiplexer B 27 to the connection line RWDb, to which the read-write multiplexer B 27, the secondary sense amplifier/write driver B 25 and the bidirectional transfer type buffer 16 are connected. At this moment, the bidirectional transfer type buffer 16 would not operate since the CTL1 remains "L", and the input information is conveyed to the secondary sense amplifier/write driver B 25 and then written in a memory cell in a predetermined region of the memory cell block B 24. In this case, the information is conveyed directly from the read-write multiplexer B 27 to the secondary sense amplifier/write driver B 25.

Figure 10:
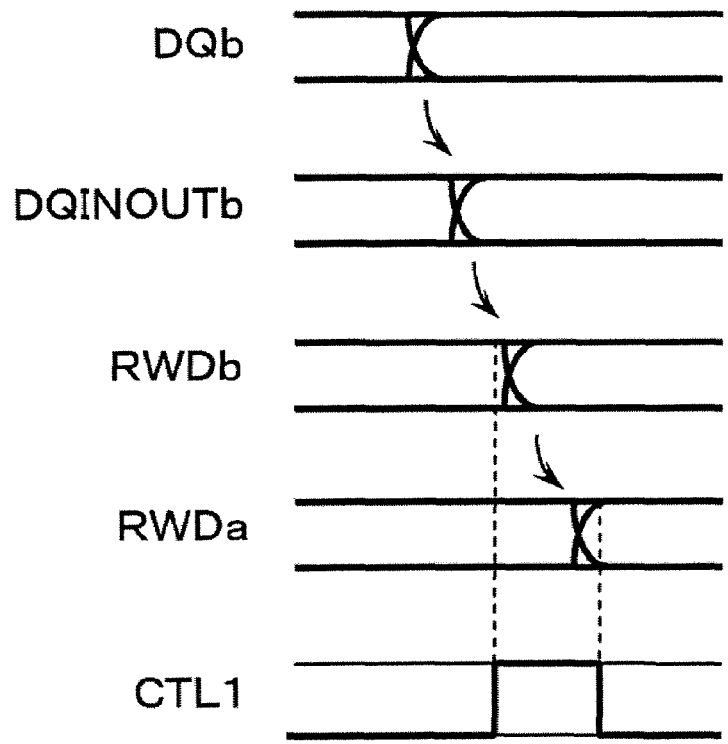
FIG. 10 illustrates a write operation (4) of the semiconductor device in accordance with the first embodiment.

As illustrated in FIG. 10, when the information input from the input/output terminal B 29 is written in the memory cell block A 14, the information needs to be conveyed via the bidirectional transfer type buffer 16. Thus, the information input from the input/output terminal B 29 is conveyed to the connection line DQb and then to the connection line DQINOUTb via the input/output circuit B 28. The information conveyed to the connection line DQINOUTb is further conveyed via the read-write multiplexer B 27 to the connection line RWDb, to which the read-write multiplexer B 27, the secondary sense amplifier/write driver B 25 and the bidirectional transfer type buffer 16 are connected. At this moment, the CTL1 turns to "H" and the information conveyed to the connection line RWDb is further conveyed to the connection line RWDa via the bidirectional transfer type buffer 16. Then, the information conveyed to the connection line RWDa is further conveyed to the secondary sense amplifier/write driver A 15 and written in a memory cell in a predetermined region of the memory cell block A 14.

From the above description, when reading information in the cases of FIG. 4 and FIG. 6, although it is necessary to transfer data from the connection line RWDa to the connection line RWDb, or vice versa, the bidirectional transfer type buffer 16 enables even small circuits to provide high-speed data transfer. In addition, in the cases of FIG. 3 and FIG. 5, it is not necessary to transfer data from the connection line RWDa to the connection line RWDb, or vice versa, and thus information can be read, without intervention by the bidirectional transfer type buffer 16, by keeping both the CTL0 and the CTL1 at an "L" state so that power consumption may be reduced.

In addition, when writing information in the cases of FIG. 8 and FIG. 10, it is necessary to transfer data from the connection line RWDa to the connection line RWDb, or vice versa, the bidirectional transfer type buffer 16 enables even small circuits to provide high-speed data transfer. In addition, in the cases of FIG. 7 and FIG. 9, it is not necessary to transfer data from the connection line RWDa to the connection line RWDb, or vice versa, and thus information can be read, without intervention by the bidirectional transfer type buffer 16, by keeping both the CTL0 and the CTL1 at an "L" state so that power consumption may be reduced.

The bidirectional transfer type buffer 16 described above enables output of data, which is read from the memory cell block A or the memory cell block B, to any of the input/output terminal A or the input/output terminal B in a small-sized and high-speed configuration with reduced power consumption. Similarly, it also enables writing of data, which is input from the input/output terminal A or the input/output terminal B, to any of the memory cell block A or the memory cell block B.

Meanwhile, the pseudo static RAM (PSRAM) 10 of this embodiment may be any semiconductor memory such as DRAM, SRAM or flash memory.

Second Embodiment

Figure 11:
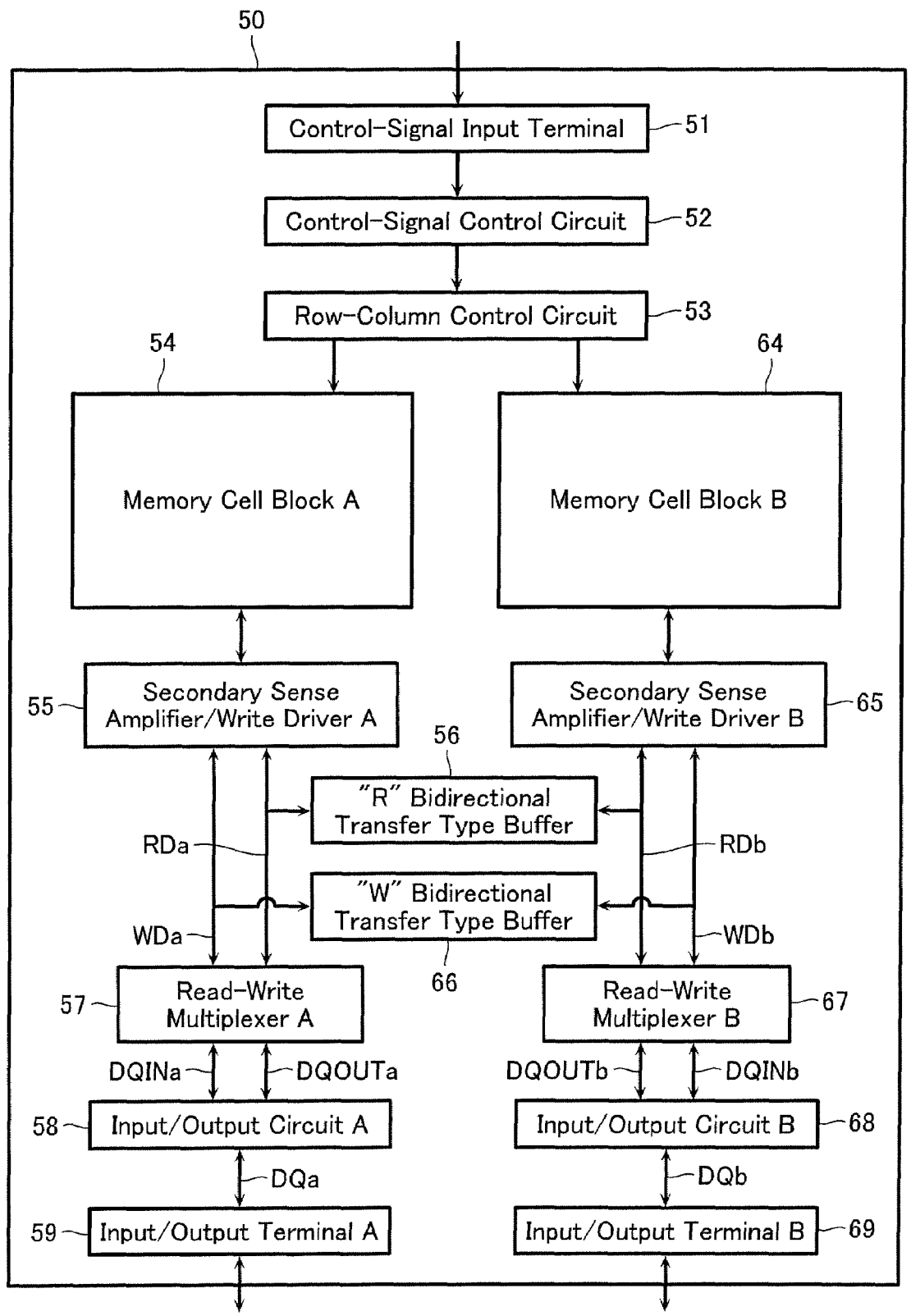
FIG. 11 is a configuration diagram of a semiconductor device in accordance with a second embodiment.

FIG. 11 illustrates a pseudo static RAM (PSRAM) 50 in accordance with this embodiment. The pseudo static RAM (PSRAM) 50 of this embodiment has a control-signal input terminal 51 for inputting control signals from outside, which are conveyed to a control-signal control circuit 52. In the control-signal control circuit 52, a control signal is generated based on the input control signal to control each of memory cell blocks A 54 and B 64 via a row-column control circuit 53.

In addition, input and output of data in the pseudo static RAM (PSRAM) 50 of this embodiment are performed through an input/output terminal A 59 and an input/output terminal B 69. The input/output terminals A 59 and B 69 are connected to their corresponding input/output circuits A 58 and B 68 through a DQa line and a DQb line, respectively. In addition, the input/output circuit A 58 is connected to a read-write multiplexer A 57 through a connection line DQINa for writing and a connection line DQOUTa for reading, while the input/output circuit B 68 is connected to a read-write multiplexer B 67 through a connection line DQINb for writing and a connection line DQOUTb for reading.

The read-write multiplexers A 57 and B 67 are connected to their corresponding control circuits of this embodiment, i.e., secondary sense amplifiers/write drivers A 55 and B 65 through each connection line WDa and WDb for writing and each connection line RDa and RDb for reading, respectively. In addition, a "W" bidirectional transfer type buffer 66 is provided between, and also connected to, the connection line WDa (a connection line for writing between the read-write multiplexer A 57 and the secondary sense amplifier/write driver A 55) and the connection line WDb (a connection line for writing between the read-write multiplexer B 67 and the secondary sense amplifier/write driver B 65). On the other hand, an "R" bidirectional transfer type buffer 56 is provided between, and also connected to, the connection line RDa (a connection line for reading between the read-write multiplexer A 57 and the secondary sense amplifier/write driver A 55) and the connection line RDb (a connection line for reading between the read-write multiplexer B 67 and the secondary sense amplifier/write driver B 65).

Figure 12:
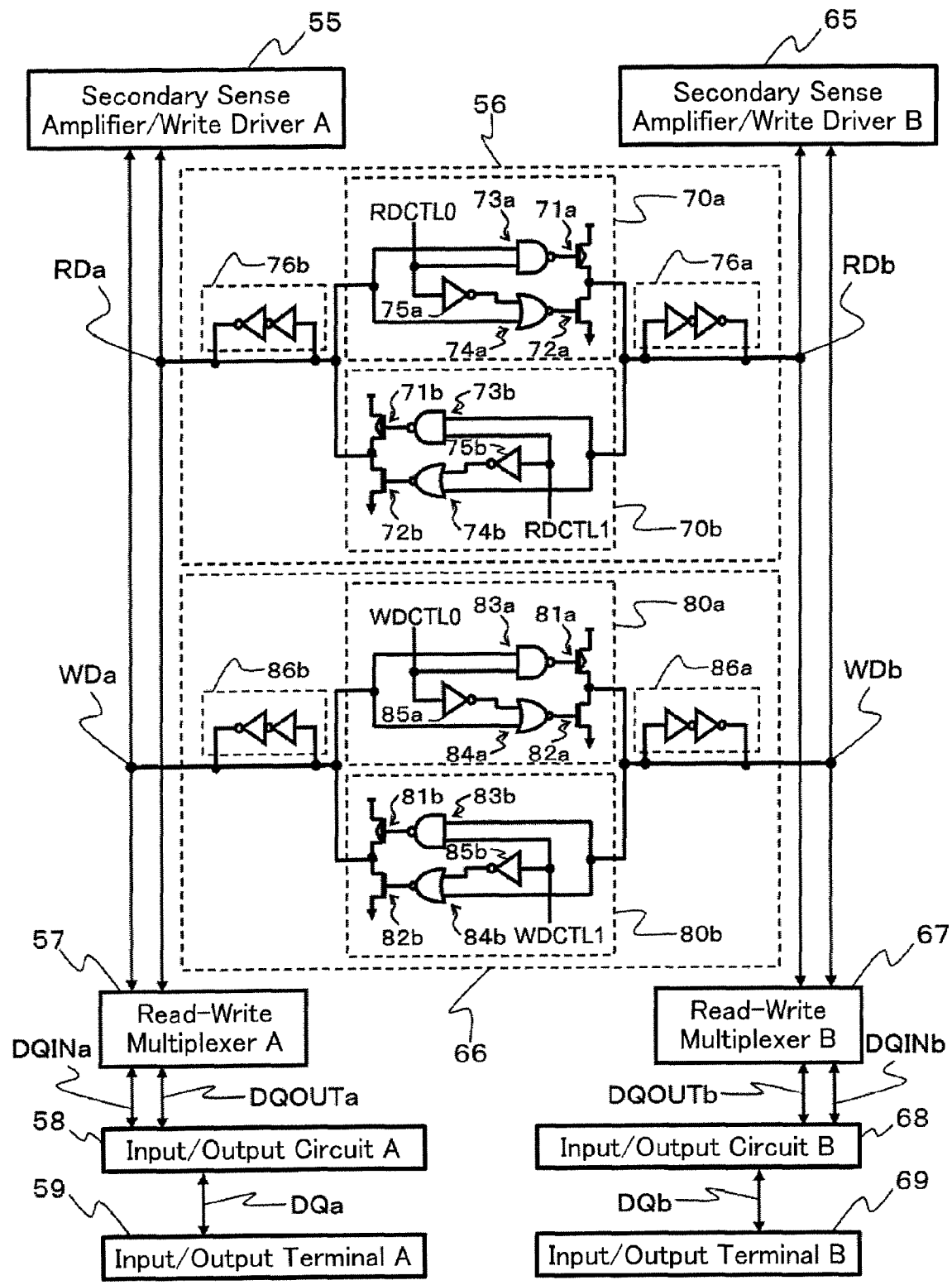
FIG. 12 is a configuration diagram illustrating essential parts of the semiconductor device in accordance with the second embodiment.

Next, the "R" bidirectional transfer type buffer 56 and the "W" bidirectional transfer type buffer 66 will be described in detail based on FIG. 12. FIG. 12 illustrates a peripheral configuration of the "R" bidirectional transfer type buffer 56 and the "W" bidirectional transfer type buffer 66 in the pseudo static RAM (PSRAM) 50 illustrated in FIG. 11.

The "R" bidirectional transfer type buffer 56 of this embodiment comprises two transfer circuits 70a and 70b. The transfer circuit 70a has a function of transferring information from the RDa line to the RDb line. The transfer circuit 70b has a function of transferring information from the RDb line to the RDa line. The output terminal of one of the transfer circuits 70a and 70b is connected to the input terminal of the other of these transfer circuits, and vice versa.

In each transfer circuit 70a and 70b, drains of a p-type transistor 71a and an n-type transistor 72a are connected to each other, and drains of a p-type transistor 71b and an n-type transistor 72b are connected to each other, thereby forming each output terminal of the transfer circuits 70a and 70b, respectively. Each output terminal of NAND circuits 73a and 73b is connected to each gate of the p-type transistors 71a and 71b, respectively. In addition, each output terminal of NOR circuits 74a and 74b is connected to each gate of the n-type transistors 72a and 72b. One input terminal of each of the NAND circuits 73a and 73b and one input terminal of each of the NOR circuits 74a and 74b are connected to each other, thereby forming each input terminal of the transfer circuits 70a and 70b, respectively. That is, each information from the connection lines RDa and RDb is input to the one input terminal of each of the NAND circuits 73a and 73b and the one input terminal of each of the NOR circuits 74a and 74b. In addition, the other input terminal of each of the NAND circuits 73a and 73b and the other input terminal of each of the NOR circuits 74a and 74b via inverters 75a and 75b are connected to each other, and each input terminal is connected to each input terminal for control signals RDCTL0 and RDCTL1, respectively. That is, control signals RDCTL0 and RDCTL1 are input to the other input terminal of each of the NAND circuits 73a and 73b, while inverted signals of the control signals RDCTL0 and RDCTL1 are input to the other input terminal of each of the NOR circuits 74a and 74b.

In addition, the output terminal of the transfer circuit 70a, which is configured by a connection point between the drains of the p-type transistor 71a and the n-type transistor 72a, is connected to the input terminal of the transfer circuit 70b. The input terminal of the transfer circuit 70b is formed by connecting one input terminal of the NAND circuit 73b to one input terminal of the NOR circuit 74b. The input terminal of the transfer circuit 70b is also connected to the connection line RDb between the secondary sense amplifier/write driver B 65 and the read-write multiplexer B 67. In addition, a data retaining circuit 76a is provided for the connection line RWDb.

On the other hand, the output terminal of the transfer circuit 70b, which is configured by a connection point between the drains of the p-type transistor 71b and the n-type transistor 72b, is connected to the input terminal of the transfer circuit 70a. The input terminal of the transfer circuit 70a is formed by connecting one input terminal of the NAND circuit 73a to one input terminal of the NOR circuit 74a, and it is also connected to the connection line RDa between the secondary sense amplifier/write driver A 55 and the read-write multiplexer A 57. A data retaining circuit 76b is provided for the connection line RDa.

In addition, the "W" bidirectional transfer type buffer 66 comprises two transfer circuits 80a and 80b. The transfer circuit 80a has a function of transferring information from the WDa line to the WDb line. The transfer circuit 70b has a function of transferring information from the WDb line to the WDa line. The output terminal of one of the transfer circuits 80a and 80b is connected to the input terminal of the other of these transfer circuits, and vice versa.

In each transfer circuit 80a and 80b, drains of a p-type transistor 81a and an n-type transistor 82a are connected to each other, and drains of a p-type transistor 81b and an n-type transistor 82b are connected to each other, thereby forming each output terminal of the transfer circuits 80a and 80b, respectively. Each output terminal of NAND circuits 83a and 83b is connected to each gate of the p-type transistors 81a and 81b, respectively. In addition, each output terminal of NOR circuits 84a and 84b is connected to each gate of the n-type transistors 82a and 82b. One input terminal of each of the NAND circuits 83a and 83b and one input terminal of each of the NOR circuits 84a and 84b are connected to each other, thereby forming each input terminal of the transfer circuits 80a and 80b, respectively. That is, each information from the connection lines WDa and WDb is input to the one input terminal of each of the NAND circuits 83a and 83b and the one input terminal of each of the NOR circuits 84a and 84b. In addition, the other input terminal of each of the NAND circuits 83a and 83b and the other input terminal of each of the NOR circuits 84a and 84b via inverters 85a and 85b are connected to each other, and each input terminal is connected to each input terminal for control signals WDCTL0 and WDCTL1, respectively. That is, control signals WDCTL0 and WDCTL1 are input to the other input terminal of each of the NAND circuits 83a and 83b, while inverted signals of the control signals WDCTL0 and WDCTL1 are input to the other input terminal of each of the NOR circuits 84a and 84b.

In addition, the output terminal of the transfer circuit 80a, which is configured by a connection point between the drains of the p-type transistor 81a and the n-type transistor 82a, is connected to the input terminal of the transfer circuit 80b. The input terminal of the transfer circuit 80b is formed by connecting one input terminal of the NAND circuit 83b to one input terminal of the NOR circuit 84b, and it is also connected to the connection line WDb between the secondary sense amplifier/write driver B 65 and the read-write multiplexer B 67. A data retaining circuit 86a is provided for the connection line WDb.

On the other hand, the output terminal of the transfer circuit 80b, which is configured by a connection point between the drains of the p-type transistor 81b and the n-type transistor 82b, is connected to the input terminal of the transfer circuit 80a. The input terminal of the transfer circuit 80a is formed by connecting one input terminal of the NAND circuit 83a to one input terminal of the NOR circuit 84a, and it is also connected to the connection line WDa between the secondary sense amplifier/write driver A 55 and the read-write multiplexer A 57. A data retaining circuit 86b is provided for the connection line WDa.

Next, a reading method in the pseudo static RAM (PSRAM) 50 of this embodiment will be described.

Figure 13:
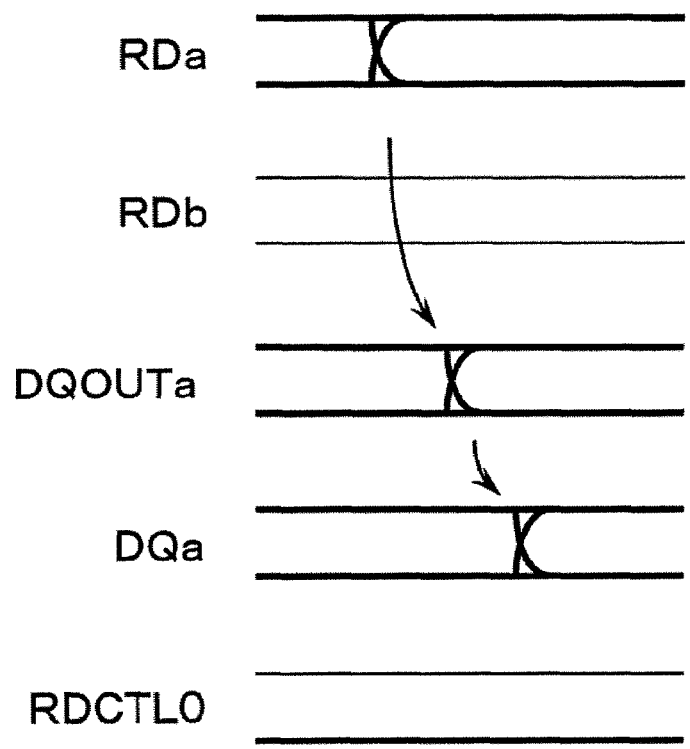
FIG. 13 illustrates a read operation (1) of the semiconductor device in accordance with the second embodiment.

As illustrated in FIG. 13, when information stored in the memory cell block A 54 is read by the input/output terminal A 59, the information does not need to be conveyed via the "R" bidirectional transfer type buffer 56. Thus, the information read from the memory cell block A 54 is conveyed to the secondary sense amplifier/write driver A 55. Thereafter, the "R" bidirectional transfer type buffer 56 would not operate since the RDCTL0 remains "L" when information is conveyed to the connection line RDa, to which the secondary sense amplifier/write driver A 55, the read-write multiplexer A 57 and the "R" bidirectional transfer type buffer 56 are connected, and the information conveyed to the connection line RDa is further conveyed to the connection line DQOUTa via the read-write multiplexer A 57. The information is then conveyed to the connection line DQa via the input/output circuit A 58 and output from the input/output terminal A 59. In this case, the information is conveyed directly from the secondary sense amplifier/write driver A 55 to the read-write multiplexer A 57.

Figure 14:
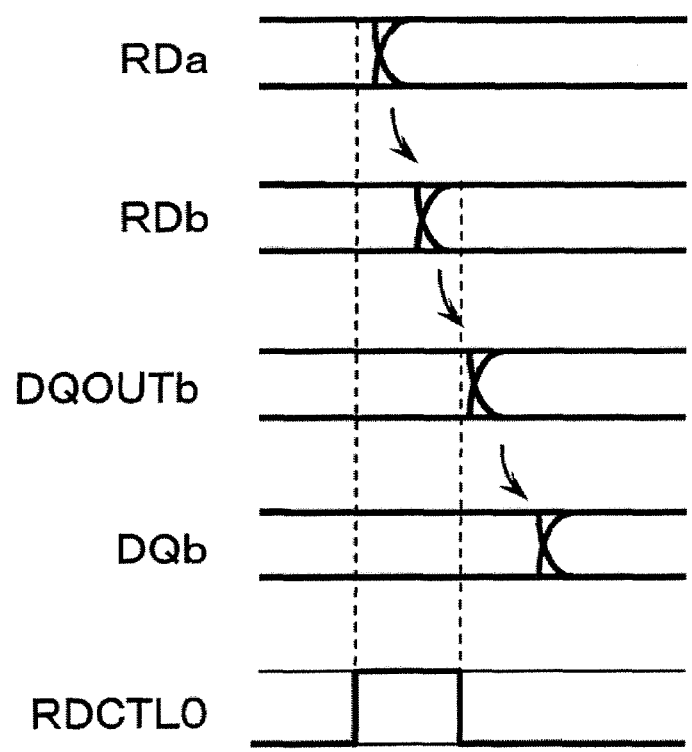
FIG. 14 illustrates a read operation (2) of the semiconductor device in accordance with the second embodiment.

As illustrated in FIG. 14, when information stored in the memory cell block A 54 is read by the input/output terminal B 69, the information needs to be conveyed via the "R" bidirectional transfer type buffer 56. Thus, the information read from the memory cell block A 54 is conveyed to the secondary sense amplifier/write driver A 55. Thereafter, upon the information being conveyed to the connection line RDa, to which the secondary sense amplifier/write driver A 55, the read-write multiplexer A 57 and the "R" bidirectional transfer type buffer 56 are connected, the RDCTL0 turns to "H". Accordingly, the information in the connection line RDa is conveyed to the connection line RDb via the "R" bidirectional transfer type buffer 56. Then, the information conveyed to the connection line RDb is further conveyed to the connection line DQOUTb via the read-write multiplexer B 67 and subsequently to the connection line DQb via the input/output circuit B 68, after which it is output from the input/output terminal B 69.

Figure 15:
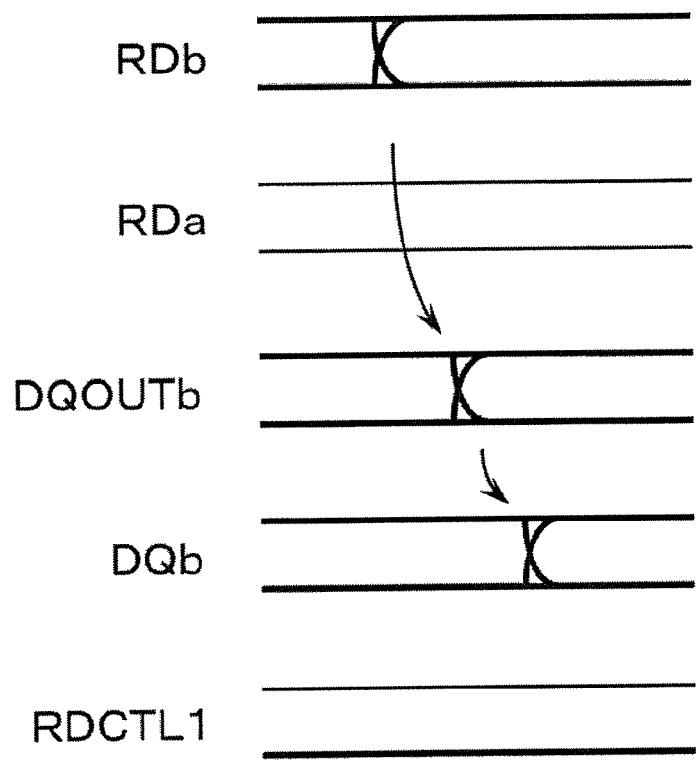
FIG. 15 illustrates a read operation (3) of the semiconductor device in accordance with the second embodiment.

As illustrated in FIG. 15, when information stored in the memory cell block B 64 is read by the input/output terminal B 69, the information does not need to be conveyed via the "R" bidirectional transfer type buffer 56. Thus, the information read from the memory cell block B 64 is conveyed to the secondary sense amplifier/write driver B 65. Thereafter, the "R" bidirectional transfer type buffer 56 would not operate since the RDCTL1 remains "L" when the information is conveyed to the connection line RDb, to which the secondary sense amplifier/write driver B 65, the read-write multiplexer B 67 and the "R" bidirectional transfer type buffer 56 are connected, and the information conveyed to the connection line RDb is further conveyed to the connection line DQOUTb via the read-write multiplexer B 67 and subsequently to the connection line DQb via the input/output circuit B 68, after which it is output from the input/output terminal B 69. In this case, the information is conveyed directly from the secondary sense amplifier/write driver B 65 to the read-write multiplexer B 67.

Figure 16:
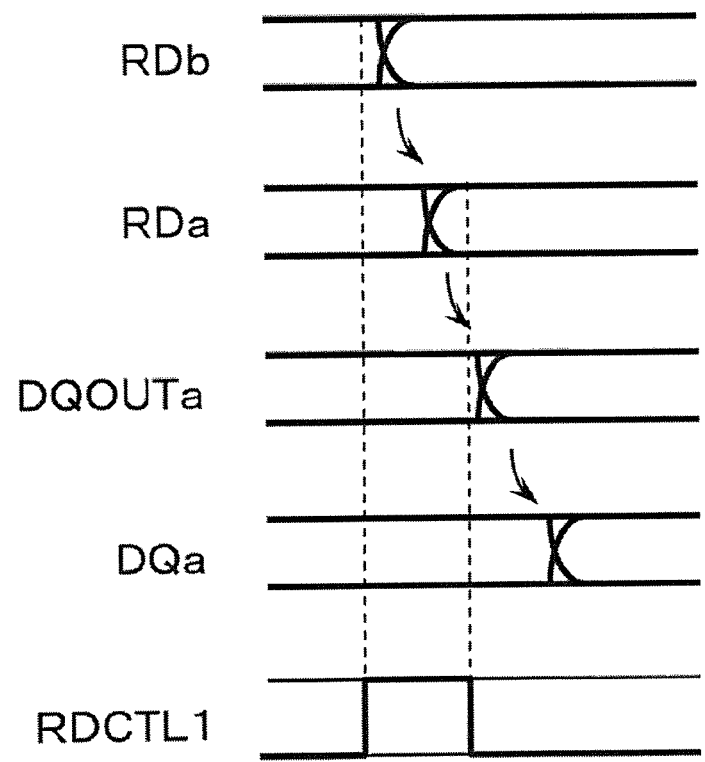
FIG. 16 illustrates a read operation (4) of the semiconductor device in accordance with the second embodiment.

As illustrated in FIG. 16, when information stored in the memory cell block B 64 is read by the input/output terminal A 59, the information needs to be conveyed via the "R" bidirectional transfer type buffer 56. Thus, the information read from the memory cell block B 64 is conveyed to the secondary sense amplifier/write driver B 65. Thereafter, upon the information being conveyed to the connection line RDb, to which the secondary sense amplifier/write driver B 65, the read-write multiplexer B 67 and the "R" bidirectional transfer type buffer 56 are connected, the RDCTL1 turns to "H". Accordingly, the information in the connection line RDb is conveyed to the connection line RDa via the "R" bidirectional transfer type buffer 56. Then, the information conveyed to the connection line RDa is further conveyed to the connection line DQOUTa via the read-write multiplexer A 57 and subsequently to the connection line DQa via the input/output circuit A 58, after which it is output from the input/output terminal A 59.

Next, a writing method in the pseudo static RAM (PSRAM) 50 of this embodiment will be described.

Figure 17:
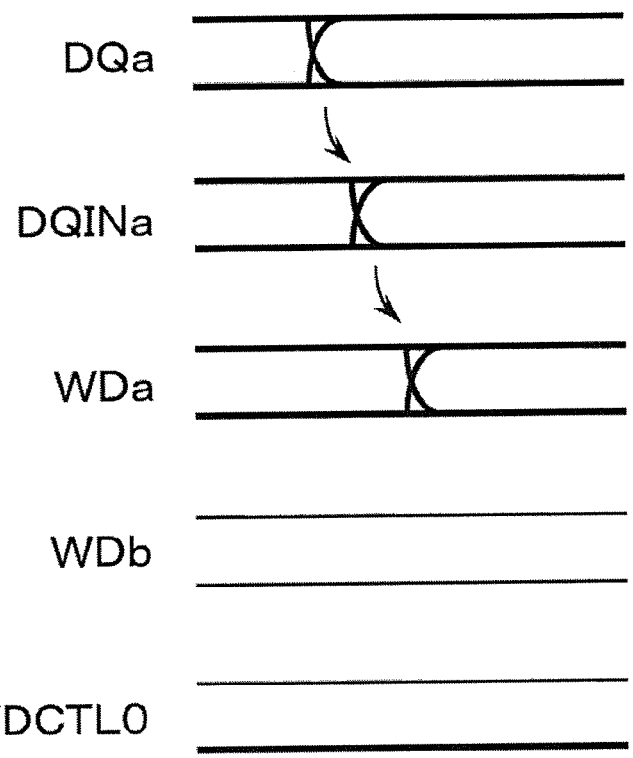
FIG. 17 illustrates a write operation (1) of the semiconductor device in accordance with the second embodiment.

As illustrated in FIG. 17, when the information input from the input/output terminal A 59 is written in the memory cell block A 54, the information does not need to be conveyed via the "W" bidirectional transfer type buffer 66. Thus, the information input from the input/output terminal A 59 is conveyed to the connection line DQa and then to the connection line DQINa via the input/output circuit A 58. The information conveyed to the connection line DQINa is further conveyed via the read-write multiplexer A 57 to the connection line WDa, to which the read-write multiplexer A 57, the secondary sense amplifier/write driver A 55 and the "W" bidirectional transfer type buffer 66 are connected. At this moment, the "W" bidirectional transfer type buffer 66 would not operate since the WDCTL0 remains "L", and the input information is conveyed to the secondary sense amplifier/write driver A 55 and then written in a memory cell in a predetermined region of the memory cell block A 54. In this case, the information is conveyed directly from the read-write multiplexer A 57 to the secondary sense amplifier/write driver A 55.

Figure 18:
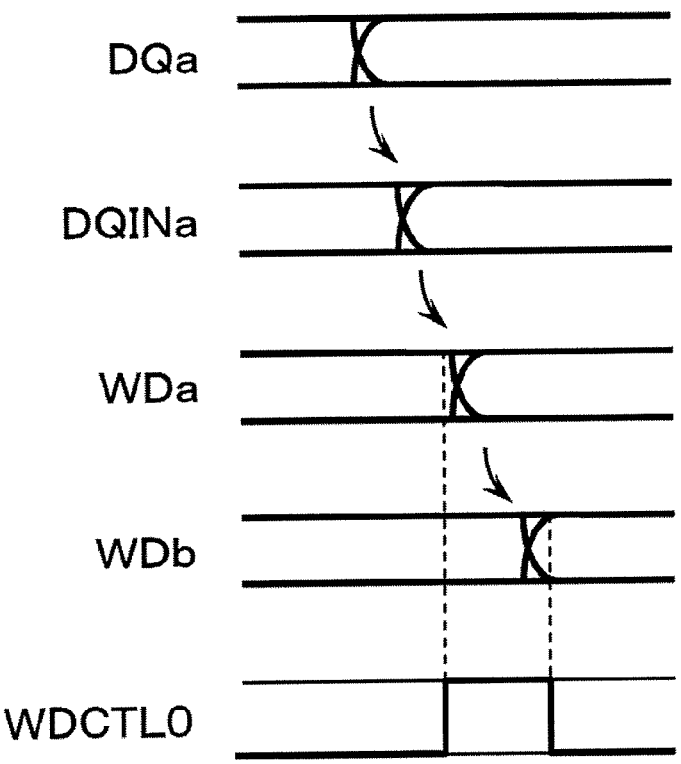
FIG. 18 illustrates a write operation (2) of the semiconductor device in accordance with the second embodiment.

As illustrated in FIG. 18, when the information input from the input/output terminal A 59 is written in the memory cell block B 64, the information needs to be conveyed via the "W" bidirectional transfer type buffer 66. Thus, the information input from the input/output terminal A 59 is conveyed to the connection line DQa and then to the connection line DQINa via the input/output circuit A 58. The information conveyed to the connection line DQINa is further conveyed via the read-write multiplexer A 57 to the connection line WDa, to which the read-write multiplexer A 57, the secondary sense amplifier/write driver A 55 and the "W" bidirectional transfer type buffer 66 are connected. At this moment, the WDCTL0 turns to "H" and the information conveyed to the connection line WDa is further conveyed to the connection line WDb via the "W" bidirectional transfer type buffer 66. Then, the information conveyed to the connection line WDb is further conveyed to the secondary sense amplifier/write driver B 65 and written in a memory cell in a predetermined region of the memory cell block B 64.

Figure 19:
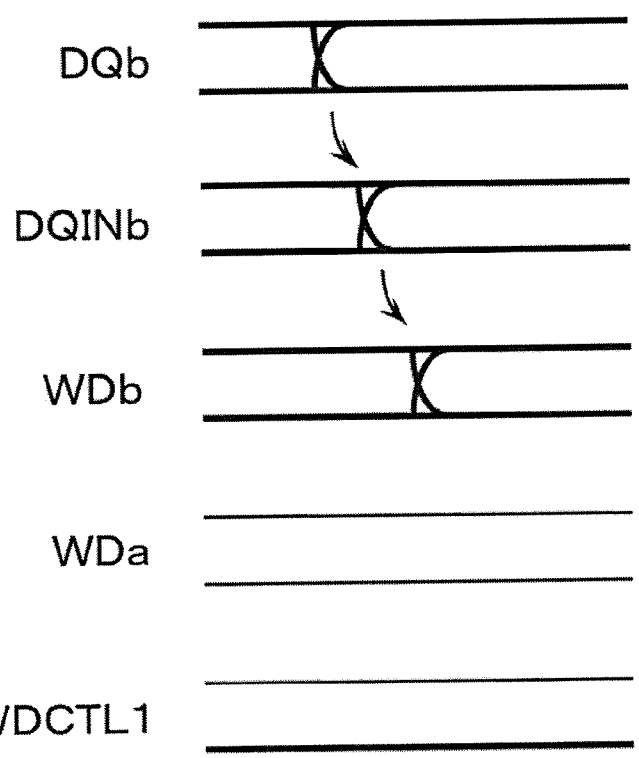
FIG. 19 illustrates a write operation (3) of the semiconductor device in accordance with the second embodiment.

As illustrated in FIG. 19, when the information input from the input/output terminal B 69 is written in the memory cell block B 64, the information does not need to be conveyed via the "W" bidirectional transfer type buffer 66. Thus, the information input from the input/output terminal B 69 is conveyed to the connection line DQb and then to the connection line DQINb via the input/output circuit B 68. The information conveyed to the connection line DQINb is further conveyed via the read-write multiplexer B 67 to the connection line WDb, to which the read-write multiplexer B 67, the secondary sense amplifier/write driver B 65 and the "W" bidirectional transfer type buffer 66 are connected. At this moment, the W bidirectional transfer type buffer 66 would not operate since the WDCTL1 remains "L", and the input information is conveyed to the secondary sense amplifier/write driver B 65 and then written in a memory cell in a predetermined region of the memory cell block B 64. In this case, the information is conveyed directly from the read-write multiplexer B 67 to the secondary sense amplifier/write driver B 65.

Figure 20:
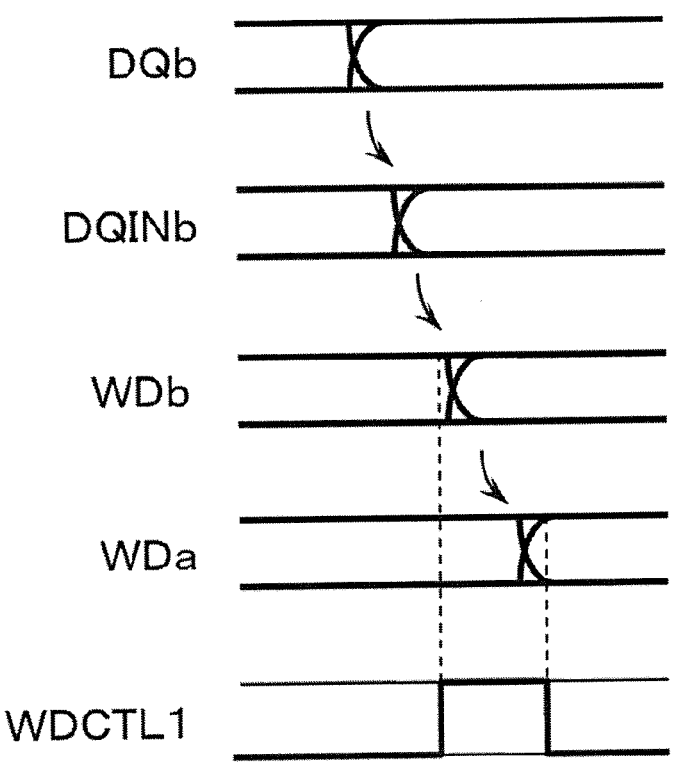
FIG. 20 illustrates a write operation (4) of the semiconductor device in accordance with the second embodiment.

As illustrated in FIG. 20, when the information input from the input/output terminal B 69 is written in the memory cell block A 54, the information needs to be conveyed via the "W" bidirectional transfer type buffer 66. Thus, the information input from the input/output terminal B 69 is conveyed to the connection line DQb and then to the connection line DQINb via the input/output circuit B 68. The information conveyed to the connection line DQINb is further conveyed via the read-write multiplexer B 67 to the connection line WDb, to which the read-write multiplexer B 67, the secondary sense amplifier/write driver B 65 and the "W" bidirectional transfer type buffer 66 are connected. At this moment, the WDCTL1 turns to "H" and the information conveyed to the connection line WDb is further conveyed to the connection line WDa via the "W" bidirectional transfer type buffer 66. Then, the information conveyed to the connection line WDa is further conveyed to the secondary sense amplifier/write driver A 55 and written in a memory cell in a predetermined region of the memory cell block A 54.

From the above description, when reading information in the cases of FIG. 14 and FIG. 16, although it is necessary to transfer data from the connection line RDa to the connection line RDb, or vice versa, the "R" bidirectional transfer type buffer 56 enables even small circuits to provide high-speed data transfer. In addition, in the cases of FIG. 13 and FIG. 15, it is not necessary to transfer data from the connection line RDa to the connection line RWDb, or vice versa, and thus information can be read, without intervention by the "R" bidirectional transfer type buffer 56, by keeping both the RDCTL0 and the RDCTL1 at an "L" state so that power consumption may be reduced.

In addition, when writing information in the cases of FIG. 18 and FIG. 20, it is necessary to transfer data from the connection line WDa to the connection line WDb, or vice versa, the "W" bidirectional transfer type buffer 66 enables even small circuits to provide high-speed data transfer. In addition, in the cases of FIG. 17 and FIG. 19, it is not necessary to transfer data from the connection line WDa to the connection line WDb, or vice versa, and thus information can be read, without intervention by the "W" bidirectional transfer type buffer 66, by keeping both the WDCTL0 and the WDCTL1 at an "L" state so that power consumption may be reduced.

The "R" bidirectional transfer type buffer 56 and the "W" bidirectional transfer type buffer 66 enables output of data, which is read from the memory cell block A or the memory cell block B, to any of the input/output terminal A or the input/output terminal B in a small-sized and high-speed configuration with reduced power consumption. Similarly, it also enables writing of data, which is input from the input/output terminal A or the input/output terminal B, to any of the memory cell block A or the memory cell block B.

Meanwhile, the pseudo static RAM (PSRAM) 50 of this embodiment may be any semiconductor memory such as DRAM, SRAM or flash memory.

Although the semiconductor device of the present invention has been described in detail with reference to embodiments thereof, the present invention is not limited to those embodiments described above, and it may take other forms than described and illustrated herein.

What is claimed is:

1. A semiconductor device comprising:
two or more memory cell blocks, each having a memory cell array of a plurality of memory cells;

a plurality of control circuits, provided in correspondence with each of the memory cell blocks, for writing information to the memory cell blocks and for reading information written in the memory cell blocks;

a plurality of input/output terminals for inputting the information to be written and for outputting the information to be read;

a plurality of multiplexers, provided in correspondence with each of the input/output terminals, for conveying the information to be written from the input/output terminals and for conveying the information to be read to the input/output terminals; and a bidirectional transfer type buffer, connected to each connection line between the control circuits and the multiplexers, for selectively conveying information from the control circuits to each of the multiplexers and for selectively conveying information from the multiplexers to each of the control circuits, wherein the bidirectional transfer type buffer comprises:

a first transfer circuit for transferring information from one of the connection lines to the other of the connection lines; and a second transfer circuit for transferring information from the other of the connection lines to the one of the connection lines;

an input terminal of the first transfer circuit and an output terminal of the second transfer circuit are connected at a first node;

an output terminal of the first transfer circuit and an input terminal of the second transfer circuit are connected at a second node;

the first node is connected to the one of the connection lines; and the second node is connected to the other of the connection lines.

2. The semiconductor device according to claim 1, wherein each of the first transfer circuit and the second transfer circuit comprises:

a p-type transistor and an n-type transistor having their drains connected to each other at a connection point;

a NAND circuit having an output terminal connected to a gate of the p-type transistor; and a NOR circuit having an output terminal connected to a gate of the n-type transistor;

information from the connection lines is input to one input terminal of the NAND circuit and one input terminal of the NOR circuit;

a control signal is input to the other input terminal of the NAND circuit; and an inverted signal of the control signal is input to the other input terminal of the NOR circuit.

3. The semiconductor device according to claim 1, wherein the bidirectional transfer type buffer comprises:

a buffer between the first node and the one of the connection lines; and another buffer between the second node and the other of the connection lines.

4. The semiconductor device according to claim 2, wherein the bidirectional transfer type buffer performs the following steps:

when information is transferred from one of the connection lines to the other of the connection lines, keeping the control signal of the first transfer circuit at an "H" state; and when information is transferred from the other of the connection lines to the one of the connection lines, keeping the control signal of the second transfer circuit at an "H" state.

5. A semiconductor device comprising:

two ore more memory cell blocks, each having a memory cell array of a plurality of memory cells;

a plurality of control circuits, provided in correspondence with each of the memory cell blocks, for writing information to the memory cell blocks;

a plurality of input terminals for inputting the information to be written;

a plurality of multiplexers, provided in correspondence with each of the input terminals, for conveying the information input from the input terminals; and a bidirectional transfer type buffer, connected to each connection line between the control circuit and the multiplexer, for selectively conveying information from the multiplexers to each of the control circuit, wherein the bidirectional transfer type buffer comprises:

a first transfer circuit for transferring information from one of the connection lines to the other of the connection lines; and a second transfer circuit for transferring information from the other of the connection lines to the one of the connection lines;

an input terminal of the first transfer circuit and an output terminal of the second transfer circuit are connected at a first node;

an output terminal of the first transfer circuit and an input terminal of the second transfer circuit are connected at a second node;

the first node is connected to the one of the connection lines; and the second node is connected to the other of the connection lines.

6. The semiconductor device according to claim 5, wherein each of the first transfer circuit and the second transfer circuit comprises:

a p-type transistor and an n-type transistor having their drains connected to each other at a connection point;

a NAND circuit having an output terminal connected to a gate of the p-type transistor; and a NOR circuit having an output terminal connected to a gate of the n-type transistor;

information from the connection lines is input to one input terminal of the NAND circuit and one input terminal of the NOR circuit;

a control signal is input to the other input terminal of the NAND circuit; and an inverted signal of the control signal is input to the other input terminal of the NOR circuit.

7. The semiconductor device according to claim 5, wherein the bidirectional transfer type buffer comprises:

a buffer between the first node and the one of the connection lines; and another buffer between the second node and the other of the connection lines.

8. The semiconductor device according to claim 6, wherein the bidirectional transfer type buffer performs the following steps:

when information is transferred from one of the connection lines to the other of the connection lines, keeping the control signal of the first transfer circuit at an "H" state; and when information is transferred from the other of the connection lines to the one of the connection lines, keeping the control signal of the second transfer circuit at an "H" state.

9. A semiconductor device comprising:
two or more memory cell blocks, each having a memory cell array of a plurality of memory cells;
a plurality of control circuits, provided in correspondence with each of the memory cell blocks, for reading information written in the memory cell blocks;
a plurality of output terminals for outputting the information to be read;
a plurality of multiplexers, provided in correspondence with each of the output terminals, for conveying the information to be read to the output terminals; and
a bidirectional transfer type buffer, connected to each connection line between the control circuits and the multiplexers, for selectively conveying information from the control circuits to each of the multiplexers,
wherein the bidirectional transfer type buffer comprising:
a first transfer circuit for transferring information from one of the connection lines to the other of the connection lines;
a second transfer circuit for transferring information from the other of the connection lines to the one of the connection lines;
an input terminal of the first transfer circuit and an output terminal of the second transfer circuit are connected at a first node;
an output terminal of the first transfer circuit an input terminal of the second transfer circuit are connected at a second node;
the first node is connected to the one of the connection lines; and
the second node is connected to the other of the connection lines.

10. The semiconductor device according to claim 9, wherein
each of the first transfer circuit and the second transfer circuit comprises:
a p-type transistor and an n-type transistor having their drains connected to each other at a connection point;
a NAND circuit having an output terminal connected to a gate of the p-type transistor; and
a NOR circuit having an output terminal connected to a gate of the n-type transistor;
information from the connection lines is input to one input terminal of the NAND circuit and one input terminal of the NOR circuit;
a control signal is input to the other input terminal of the NAND circuit; and
an inverted signal of the control signal is input to the other input terminal of the NOR circuit.

11. The semiconductor device according to claim 9, wherein the bidirectional transfer type buffer comprises:
a buffer between the first node and the one of the connection lines; and
another buffer between the second node and the other of the connection lines.

12. The semiconductor device according to claim 10, wherein the bidirectional transfer type buffer performs the following steps:
when information is transferred from one of the connection lines to the other of the connection lines, keeping the control signal of the first transfer circuit at an "H" state; and
when information is transferred from the other of the connection lines to the one of the connection lines, keeping the control signal of the second transfer circuit at an "H" state.

* * * * *